United States Patent [19]

Ganesan

[11] Patent Number: 4,531,106
[45] Date of Patent: Jul. 23, 1985

[54] SWITCHED CAPACITOR CIRCUITS
[75] Inventor: Apparajan Ganesan, Indianapolis, Ind.
[73] Assignee: AT&T Technologies, Inc., Berkeley Heights, N.J.
[21] Appl. No.: 539,004
[22] Filed: Oct. 4, 1983
[51] Int. Cl.$^3$ .................. H03H 19/00; G11C 27/02
[52] U.S. Cl. .................... 333/173; 307/523; 328/151; 330/9
[58] Field of Search .................. 333/19-20, 333/172-173, 167, 175; 364/724, 725; 328/151, 167; 307/352, 353, 491-494, 501-502, 520-523; 330/9, 107, 257, 288

[56] References Cited
U.S. PATENT DOCUMENTS
4,315,227  2/1982  Fleischer et al. .................. 333/173

Primary Examiner—Marvin L. Nussbaum
Attorney, Agent, or Firm—Volker R. Ulbrich

[57] ABSTRACT

A switched capacitor biquadratic filter (10; 20) includes means for dynamically shifting the level of the input voltage ($V_B$, $V_D$; $V_X$, $V_Y$,) of the amplifiers (12, 14), so that the need for a level shifting stage in the amplifiers (12; 14) is eliminated. The normally grounded nodes associated with the input ports of the amplifiers (12; 14) are set to a reference voltage ($V_B$, $V_D$; $V_X$, $V_Y$) which shifts the inputs to a level appropriate to result in an analog grounded voltage at the outputs of the amplifiers. Internal level shifting stages are thereby eliminated from the amplifiers (12; 14). This gives the filter (10, 20) a broader operating frequency range.

Also disclosed is a particular design for the amplifiers (12, 14) which includes a folded cascode mirror configuration.

6 Claims, 3 Drawing Figures

1

SWITCHED CAPACITOR CIRCUITS

TECHNICAL FIELD

The invention relates generally to switched capacitor circuits with one or more amplifiers connected in series with each other and relates more particularly to filters which have one or more amplifiers coupled by switched capacitors.

BACKGROUND OF THE INVENTION

One type of circuit which includes two or more amplifiers coupled by switched capacitors is a switched capacitor biquadratic amplifier circuit such as is used widely in switched capacitor filter circuits. A generalized circuit of this type is described, for example, in U.S. Pat. No. 4,315,227 issued Feb. 9, 1982 to P. E. Fleischer and K. R. Laker and assigned to the same assignee as is the present invention. There is a need for improving the performance of the two amplifiers since their performance is very significant in determining the overall operating limitations of the circuit, i.e., the frequency range or bandwidth.

SUMMARY OF THE INVENTION

In the novel circuit in accordance with the present invention, the switched capacitor input to the amplifiers is referenced to a different voltage than the d.c. (direct current) voltage level of the amplifier output in the quiescent state. This provides a dynamically level shifted input to the amplifier which makes unnecessary a level shifting stage internal to the amplifier itself. Elimination of the internal level shifting stage removes a significant limitation on the amplifier frequency range and improves its performance.

This dynamic level shifting may be advantageously used in a generalized switched capacitor filter circuit to improve its frequency range and bandwidth.

DETAILED DESCRIPTION

Figure 1:
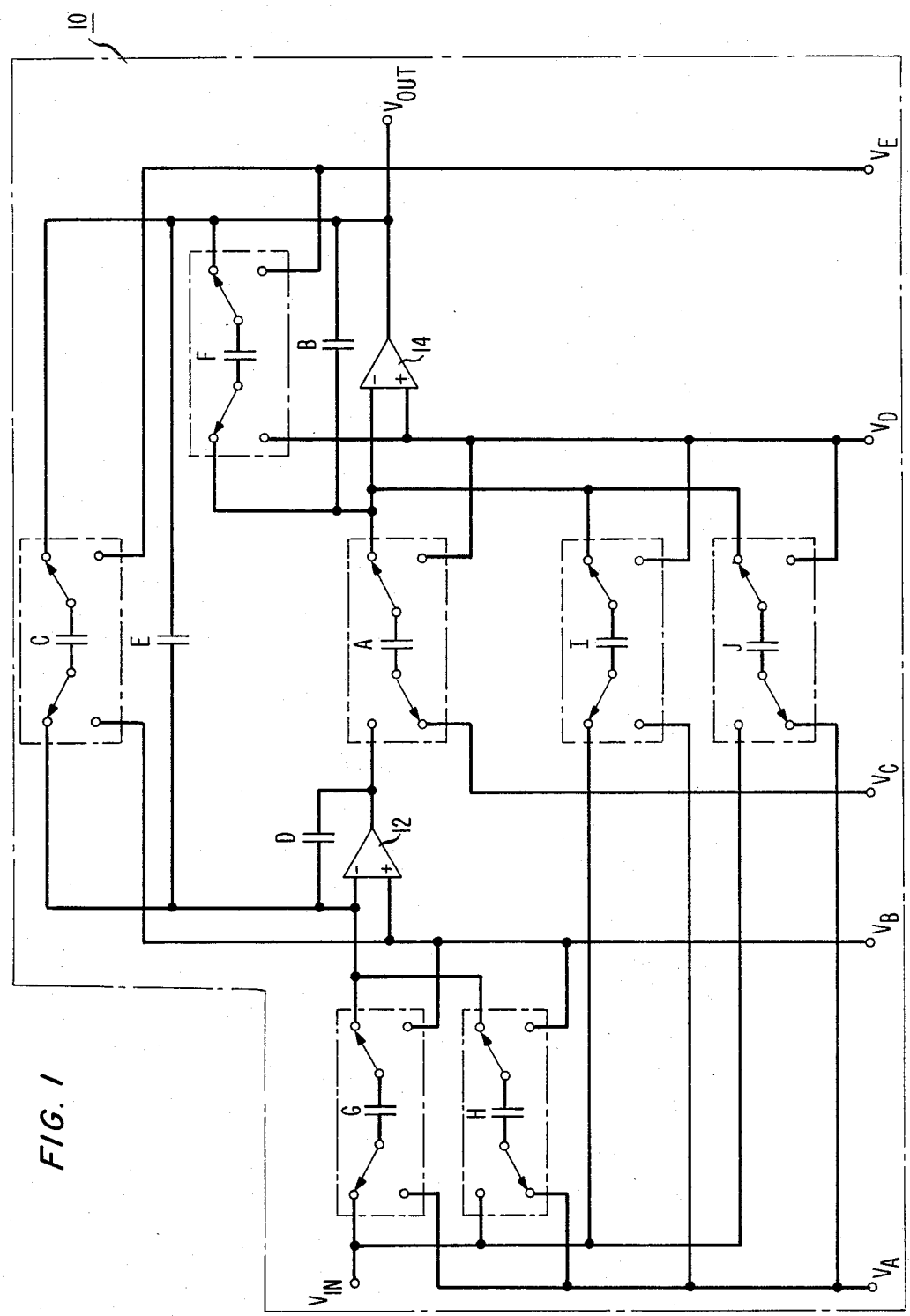
FIG. 1 is a schematic circuit diagram of a generalized switched capacitor biquadratic filter in accordance with one embodiment of the present invention.

FIG. 1 shows a generalized biquadratic switched capacitor filter 10 of the general type disclosed in the above mentioned patent; its particular operation is described there and that description is incorporated herein by reference. The filter 10 includes first and second operational amplifiers 12, 14 and an array of unswitched capacitors B, D, and E; through-switched capacitors C, F, G, and I; and diagonally-switched capacitors A, H, and J. As used herein the term "unswitched capacitor" shall be understood to refer to the capacitor that is permanently connected in the circuit. A "through-switched" capacitor shall be understood to refer to a switched capacitor of which two terminals are simultaneously connected to reference voltages during one of the switching phases. A "diagonally-switched" capacitor is understood to refer to a switched capacitor whose terminals are alternately connected to reference voltages during successive switching phases. The reference letters of the capacitors shall also refer to their respective magnitudes. Thus, for example, the magnitude of capacitor A is A. A switched capacitor includes the capacitor and the switches associated with it. It is therefore a single two-terminal switched capacitor element.

The switches of the switched capacitors are typically implemented in the form of FET (field effect transistor) devices in ways well known to those skilled in the art. Therefore, they are represented only symbolically in the drawing, and their particular structure will not be discussed in detail.

In the filter 10 a first, unswitched feedback capacitor D is connected between the output port and the inverting input port (−) of the amplifier 12. Similarly, a second, unswitched feedback capacitor B is connected between the output port and the inverting input port (−) of the amplifier 14. A third, through-switch capacitor C is connected between the output port of the amplifier 14 and the inverting input port (−) of the amplifier 12. The two amplifiers 12, 14 are also connected by means of a diagonally switched capacitor A which connects the output port of the amplifier 12 to the inverting input port (−) of the amplifier 14. The noninverting input ports (+) of the amplifiers 12, 14 are connected to reference voltages $V_B$ and $V_D$, respectively.

The filter input terminal $V_{IN}$ is coupled to the inverting input port (−) of the amplifier 12 by means of a first input circuit comprising, in parallel, a through-switched capacitor G, and a diagonally switched capacitor H. The input terminal $V_{IN}$ is similarly coupled to the inverting input port of the amplifier 14 by means of a second input circuit comprising in parallel a through-switched capacitor I, and a diagonally switched capacitor J.

Damping is provided by the through-switched capacitor F connected in parallel with the feedback capacitor B or, alternatively, by means of an unswitched capacitor E connected in parallel with feedback capacitor C. For the sake of completeness, all the capacitors are shown, but some may have zero values for specific configurations.

The switches, illustrated in FIG. 1 as single-pole double-through break-before-make switches are shown in one of their two possible switched states. In operation, they are operated in synchronism under the control of a timing signal, not shown, which causes them to switch between their two switching states. Each switch has its side of the capacitor with which it is associated alternately to the signal path and to a reference voltage terminal. The switches on the signal input $V_{IN}$ side of the switched capacitors G, H, I, and J have their reference voltage terminals connected to a reference voltage $V_A$. The switches on the amplifier 12 side of the switched capacitors G and H have their reference voltage terminals connected to a reference voltage $V_B$. The noninverting input port (+) of the amplifier 12 is also connected to this reference voltage $V_B$. The switch associated with the switched capacitor A on the amplifier 12 output side has its reference voltage terminal connected to a reference voltage $V_C$. The switches associated with the switched capacitors A, I, J, and F on the side toward the inverting input of the amplifier 14 have their reference voltage terminals connected to reference voltage $V_D$. The noninverting input port (+) of the amplifier 14 is connected to the reference voltage $V_D$. The switches between the output of the amplifier 14 and the capacitors C and F have their reference voltage terminals connected to a reference voltage $V_E$. The reference voltages $V_A$, $V_B$, $V_C$, $V_D$ and $V_E$ are provided by reference voltage sources not shown in detail. Such reference voltages would ordinarily be readily available on an integrated circuit chip.

The switching to the reference voltages $V_A$, $V_B$, $V_C$, $V_D$ and $V_E$ at the respective nodes in the filter 10 provides a means which dynamically establishes those reference voltage levels there without otherwise affecting the operation of the circuit, which is described in the above-mentioned patent. For example, under steady-state conditions, with the input $V_{IN}$ being shorted to the reference voltage $V_A$, the output port of the amplifier 12 will be at a d.c. level $V_C$, and the output port of the amplifier 14 will be at a d.c. level $V_E$. It can be seen that the reference voltage $V_B$ which appears at the noninverting input of the amplifier 10 need not be the same as the reference voltage $V_C$ which appears at the output of the amplifier 12. Likewise, the reference voltage $V_D$ which appears at the noninverting input of the amplifier 14 need not be the same as the reference voltage $V_E$ at the output of the amplifier 14. Thus, while the switched capacitors A, C, F, G, H, I, and J of the circuit are being operated by their switches, the amplifiers can be operated with a voltage level shift dynamically imposed on them between their input and output. This makes it unnecessary to provide a level shifting stage within the amplifier and leads to a simplification of the amplifier design which improves the operation of the amplifier and of the filter 10 as a whole.

Figure 2:
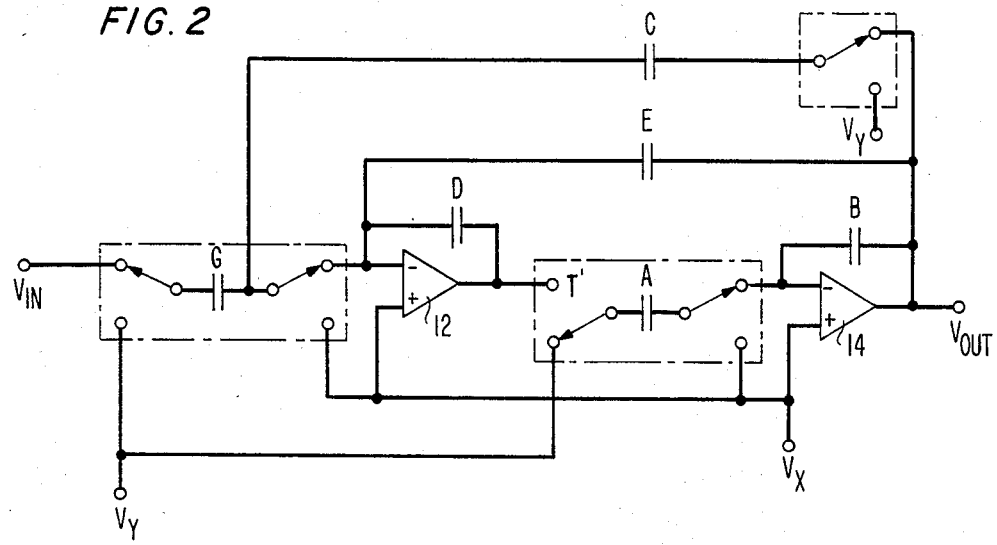
FIG. 2 is a schematic circuit diagram of a more specific switched capacitor filter of the general type shown in FIG. 1 and in accordance with another embodiment of the invention.

While the filter 10 in FIG. 1 represents the most general case for a filter circuit in accordance with the present invention, a specific filter design is likely to permit some simplification, so that it includes a smaller number of capacitors and switches. The filter 20 of FIG. 2 includes a diagonally switched capacitor A, through-switched capacitor G and C, and unswitched capacitors B, C, D and E. It is a specific, low-pass design of the more general filter 10 of FIG. 1, and corresponding elements are assigned the same reference symbols. Two different reference voltage levels $V_X$ and $V_Y$ are applied to the reference voltage nodes with the reference voltages $V_A$, $V_C$ and $V_E$ all at voltage $V_X$. The nodes $V_B$ and $V_D$ are at voltage $V_Y$. The difference between the reference voltage $V_X$ at the noninverting inputs of the amplifiers 12, 14 and the reference voltage $V_Y$ at the outputs of the amplifiers 12, 14 are chosen to permit the amplifiers 12, 14 to operate without internal level shifting. An amplifier of the type used in prior art circuits of this type generally has two stages. The first stage would include a differential input with amplification, or gain. The second stage, in addition to providing d.c. (direct current) gain, also would provide the additional d.c. level shift function. For effective operation of the amplifier, the first stage output level should be at a d.c. voltage no lower than the input common mode voltage, minus a transistor threshold voltage, at the peak value of the first stage output signal. In addition, the second stage reduces the effective settling time under capacitive loaded conditions to a few microseconds.

Figure 3:
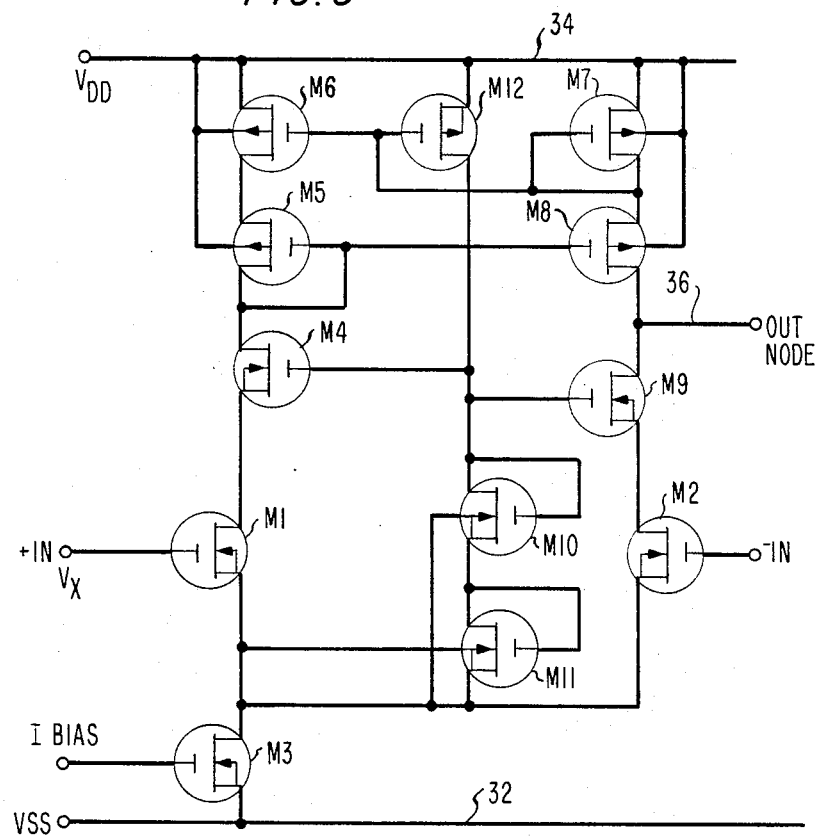
FIG. 3 is a schematic circuit diagram of one of the amplifiers of the filter shown in FIG. 2.

The dynamically level shifted input to the amplifiers 10, 12, however, permits them to have a simplified design, as shown in FIG. 3, which does not include a second level shifting stage. FIG. 3 shows in more detail the amplifier 12 of the filter 20 of FIG. 2, which may be identical to the amplifier 14. It is a CMOS (complementary metal-oxid-semiconductor) circuit in which all the transistors are enhancement mode devices. It includes a pair of N-channel differential input transistors M1, M2 which have their sources connected together and to the drain of a N-channel bias current transistor M3, which in turn has its source connected to a negative power supply voltage rail 32. Two P-channel transistors, M5, M6 and an N-channel transistor M4 have their conduction paths connected respectively in series between a positive voltage supply rail 34 and the drain of the noninverting input transistor M1. Two P-channel transistors M7 and M8 and an N-channel transistor M9 have their conduction paths connected in series between the positive voltage supply rail 34 and the drain of the inverting differential input transistor M2. The transistors M6, M7 have a common gate connected to the drain of transistor M7. The transistors M5 and M8 have a common gate connected to the drain of the transistor M5. A pair of N-channel voltage limiting transistors M10 and M11 have their conduction paths connected in series between the sources of the input transistors M1, M2 and the drain of a P-channel current mirror transistor M12, which has its source connected to the positive power supply voltage rail 34 and a gate which is common with those of transistors M6 and M7. The voltage limiting transistors M10, M11 have their gates connected to their drains. The gates of the transistors M4 and M9 are tied to the drain of the current mirror transistor M12. The transistors M5 and M6 and the transistors M8 and M7 form the input and output branches, respectively, of a P-channel current mirror. The transistors M4 and M1 and the transistors M9 and M2 from the input and output branches, respectively of an N-channel current mirror. The P-channel and N-channel current mirrors are configured in a folded cascode arrangement. The output signal from the circuit 30 can be taken at an output node 36 at the common node of the transistors M8 and M9.

In the amplifier 30 the inverting ($-$) and noninverting ($+$) inputs which are at the gates of the input transistors M1 and M2, respectively, are biased by the reference voltage $V_X$ which is dynamically applied to the inverting input of the amplifier 12. It is chosen so that the input common mode range of the amplifier 12 is within a few transistor threshold voltages of the voltage of the negative power supply rail 32, while the output of the amplifier 12 is biased at analog ground potential $V_Y$. There is only a single stage of the amplifier 12. The elimination of the level shifting stages of the amplifiers 12, 14 in its filter 20 provides a significant increase in its operating frequency range of the filter 20 which can be as much as one or two orders of magnitude. This approach is applicable to high-pass, low-pass, and band-pass configurations of the filter 10 of FIG. 1. However, the invention applies to any switched capacitor active filter. It is particularly applicable to the switched capacitor biquadratic filter of the type described in the above-mentioned patent.

In the above-described example of the invention, the schematic circuit diagrams are presented with their switches connected in a manner which facilitates an understanding of the operation of the circuit. In actual practice, a particular circuit design would generally permit some simplification by a sharing of switches in known ways to reduce the total number. Examples of such sharing are discussed, for example in the above-mentioned U.S. Pat. No. 4,315,227.

What is claimed is:

1. An electronic circuit, comprising:

a first amplifier having first and second input ports and an output port, one of the input ports being connected to a first reference voltage;

a first capacitor adapted to receive an input signal at one side;

first switch means for connecting the other side of the first capacitor alternately to the other input port of the first amplifier and to the first reference voltage;

a second capacitor, and a second switch means for connecting one side of the second capacitor alternately to the first amplifier output port and to a second reference voltage, different from the first reference voltage.

2. The circuit as defined in claim 1, comprising:

a second amplifier having first and second input ports and an output port, one of the input ports being connected to a third reference voltage, and third switch means for connecting the other side of the second capacitor alternately to the other input port of the second amplifier and to the third reference potential.

3. The circuit as defined in claim 2 wherein the first and second amplifiers are single stage amplifiers.

4. The circuit as defined in claim 3 wherein the first and second amplifiers comprise field-effect transistors in a folded cascode mirror configuration.

5. The circuit as defined in claim 1 wherein the first amplifier is a single stage amplifier.

6. The circuit as defined in claim 5 wherein the first amplifier comprises field-effect transistors in a folded cascode mirror configuration.

\* \* \* \* \*